(12) United States Patent
Choy

(10) Patent No.: US 8,138,805 B2
(45) Date of Patent: Mar. 20, 2012

(54) COMPLEMENTARY HIGH VOLTAGE SWITCHED CURRENT SOURCE INTEGRATED CIRCUIT

(75) Inventor: Benedict C. K. Choy, Cupertino, CA (US)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 13/188,324

(22) Filed: Jul. 21, 2011

(65) Prior Publication Data

US 2011/0273224 A1    Nov. 10, 2011

Related U.S. Application Data

(62) Division of application No. 12/869,406, filed on Aug. 26, 2010, now abandoned, which is a division of application No. 12/434,862, filed on May 4, 2009, now Pat. No. 7,956,653.

(51) Int. Cl.
*H03K 3/00* (2006.01)

(52) U.S. Cl. ............................ 327/108; 327/112; 326/83

(58) Field of Classification Search .................. 327/108, 327/112; 326/82, 83
See application file for complete search history.

(56) References Cited

U.S. PATENT DOCUMENTS

| 4,578,600 | A | * | 3/1986 | Magee ............................ 326/34 |
| 5,572,147 | A | * | 11/1996 | Huang et al. .................... 326/33 |
| 5,909,134 | A | * | 6/1999 | Sohn et al. ...................... 327/295 |
| 6,549,052 | B2 | * | 4/2003 | Okayasu ......................... 327/276 |
| 6,696,865 | B2 | * | 2/2004 | Horiguchi et al. ............. 326/121 |
| 7,956,653 | B1 | * | 6/2011 | Choy et al. ...................... 327/108 |

* cited by examiner

*Primary Examiner* — Kenneth B. Wells
(74) *Attorney, Agent, or Firm* — Weiss & Moy, P.C.; Jeffrey D. Moy

(57) ABSTRACT

A complementary high voltage switched current source circuit has a complementary current source pair, wherein a first of the current source pair is coupled to a positive voltage rail and a second of the current source pair is coupled to a negative voltage rail. A digital logic-level control interface circuit is coupled to the complementary current source pair and to the positive voltage rail and the negative voltage rail. A pair of high voltage switches is coupled to the complementary current source pair and the digital logic-level control interface circuit and controlled by the digital control interface circuit.

4 Claims, 5 Drawing Sheets

COMPLEMENTARY HIGH VOLTAGE SWITCHED CURRENT SOURCE INTEGRATED CIRCUIT

RELATED APPLICATIONS

The present application is a divisional of and claims the benefit of pending U.S. patent application entitled: "COMPLEMENTARY HIGH VOLTAGE SWITCHED CURRENT SOURCE INTEGRATED CIRCUIT", Ser. No. 12/869,406, filed Aug. 26, 2010 now abandoned, and in the name of the same inventors, which is a divisional of and claims the benefit of Ser. No. 12/434,862, filed May. 4, 2009, issued U.S. Pat. No. 7,956,653, issued Jun. 7, 2011 in the name of the same inventors.

FIELD OF THE INVENTION

This invention relates generally to an ultrasound scanning image system, and more particularly, to an array of high voltage switched current sources for a high voltage ultrasound transmit pulse generator to excite the piezoelectric or capacitive-electrostatic elements in the ultrasound transducer probe in an ultrasound B-scan or a color image system.

BACKGROUND OF THE INVENTION

Ultrasound medical imaging or nondestructive testing (NDT) applications have a growing demand for more sophisticated excitation waveforms and a sequential scanning method for large numbers of piezoelectric or capacitive-electrostatic elements array. The commonly used ultrasound transmit pulse generator circuit generally consists of a pair of P-type and N-type high voltage power MOSFETs driven by a very fast and powerful gate driver circuit. Each channel of the pulse generator needs to produce high voltage and high current to charge or discharge the load capacitance at ultrasound frequency or speed. The load capacitance, including the piezoelectric or capacitive-electrostatic elements and the cable equivalent capacitance, usually is quite large. The advanced harmonic ultrasound imaging technology requires that the waveform generated from this pulse generator contains the least amount of second harmonics as possible Therefore, a need exists for a system and method to overcome the above problem. The system and method would desirably provide a transmit pulse generating circuit and method that can produce well matched rising and falling edges to allow registered users the ability of adding content, contests and promotions to web properties Therefore, a need existed to provide a system and method to overcome the above problem. The system and method it would be desirable to provide a transmit pulse generating circuit and method that can produce well matched rising and falling edges would allow registered users the ability of adding content, contests and promotions to web properties.

SUMMARY OF THE INVENTION

A complementary high voltage switched current source circuit has a complementary current source pair, wherein a first of the current source pair is coupled to a positive voltage rail and a second of the current source pair is coupled to a negative voltage rail. A digital logic-level control interface circuit is coupled to the complementary current source pair and to the positive voltage rail and the negative voltage rail. A pair of high voltage switches is coupled to the complementary current source pair and the digital logic-level control interface circuit and controlled by the digital control interface circuit.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
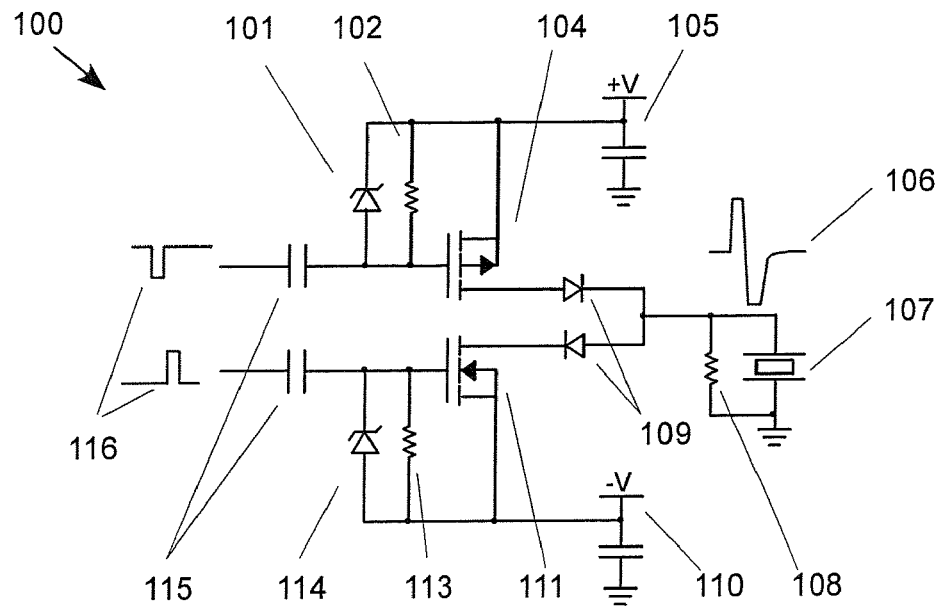
FIG. 1 is a schematic diagram illustrating a conventional prior art complementary MOSFETs ultrasound transmitter pulse generator in a typical ultrasound B-scan image system.

Referring to FIG. 1, a schematic diagram illustrating a conventional prior art complementary MOSFETs ultrasound transmitter pulse generator 100 (hereinafter pulse generator 100) in a typical ultrasound B-scan image system is shown. In the pulse generator 100, the source terminals of the P-type MOSFET 104 and N-type MOSFET 111 are connected to the positive and negative high voltage power supply rail 105 and 110 respectively. The gate terminals of the P-type MOSFET 104 and N-type MOSFET 111 are each connected to one of a pair of gate coupling capacitors 115. The pair of gate coupling capacitors 115 are driven by control waveforms 116 generated by a gate driver circuit.

The pulse generator 100 has a pair of Zener diodes 101 and 114. The Zener diodes 101 and 114 have a first terminal coupled to the positive and negative high voltage power supply rail 105 and 110 respectively and a second terminal coupled to one of the pair of gate coupling capacitors 115. The Zener diodes 101 and 114 are in parallel with gate-source DC bias voltage resistors 102 and 113 respectively.

The forward direction of the Zener diodes 101 and 114 serve as the fast DC restoring diodes function for the AC capacitor coupling gate driving circuit, while the Zener diodes break-down direction protects the possible over voltage of MOSFET gate to source voltages. The pair of switching diodes 109 work as the reverse voltage blocking as well as for ultrasound receiver isolation purposes. In the 2-level transmit pulse generator circuit the resistor 108 in parallel with the transducer 107, discharge the capacitance of the transducer back to zero voltage after the waveform transmitted. A typical waveform 106 is shown in FIG. 1.

In advanced ultrasound harmonic medical imaging systems, it is required to generate the least amount of second harmonics in the waveform as possible. Therefore to reduce the amount of second harmonics in the waveform, one should try to match the pulse rise and fall edges, as well as the pulse positive and negative duration timing and pulse amplitudes.

Because of device physics, even using the most current up to date state of art manufacturing processes, it is extremely difficult and cost prohibitive to make matching P-type and N-type MOSFETs having the same size or same current or characteristics. Presently, to approximately match the MOSFET voltage and current, the P-type MOSFET is generally two to three times bigger than the N-type MOSFET, when using complementary MOSFET pair in current ultrasound.

Figure 2:
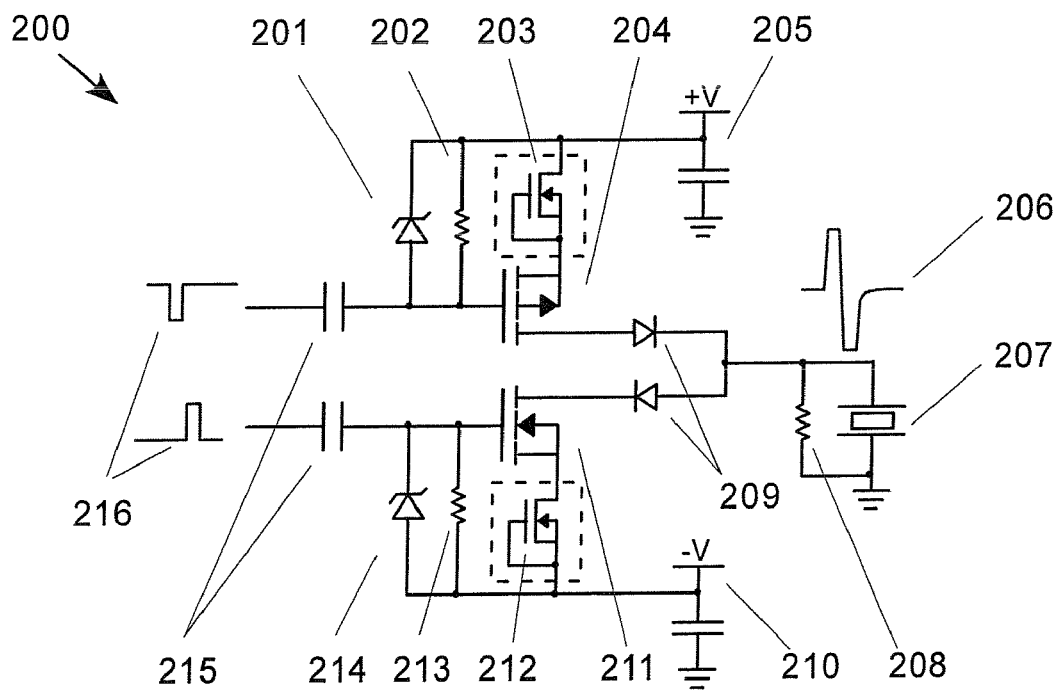
FIG. 2 is a schematic diagram illustrating a transmit pulse generate channels for a 2-level ultrasound transducer excitation waveform integrated device circuit.

Referring now to FIG. 2, one embodiment of a complementary switched current source circuit 200 is shown. The circuit 200 has a pair of gate coupling capacitors 215. Each of the pair of gate coupling capacitors 215 has a first terminal coupled to a waveform 216. Each of the coupling capacitors 215 is driven by the control waveform 216 which is generated by a gate driver circuit. The circuit 200 has a P-type MOSFET 204 and N-type MOSFET 211 each having drain, gate and source terminals. The gate terminals of the P-type MOSFET 204 and N-type MOSFET 211 are each connected to a second terminal of one of the pair of gate coupling capacitors 215. The circuit 200 has a pair of Zener diodes 201 and 214. The Zener diodes 201 and 214 have a first terminal coupled to the positive and negative high voltage power supply rail 205 and 210 respectively and a second terminal coupled to one of the pair of gate coupling capacitors 215. The Zener diodes 101 and 114 are in parallel with gate-source DC bias voltage resistors 202 and 213 respectively. The Zener diodes 201 and 214 serve the same function as in FIG. 1. The circuit 200 also has a pair of switching diodes 209. Each of the switching diodes 209 has a first terminal coupled to one of the drain terminals of the P-type MOSFET 204 and N-type MOSFET 211 and a second terminal coupled to a resistor 208 coupled in parallel with a transducer 207.

The circuit 200 uses two well matched depletion current control devices 203 and 212 in series with the source terminals of the P-type MOSFET 204 and N-type MOSFET 211 respectively and power supply rails 205 and 210 respectively. The addition of the control devices 203 and 212 provides tight current matching between positive and negative going current when the MOSFET switch 204 or 211 is activated.

Figure 3:
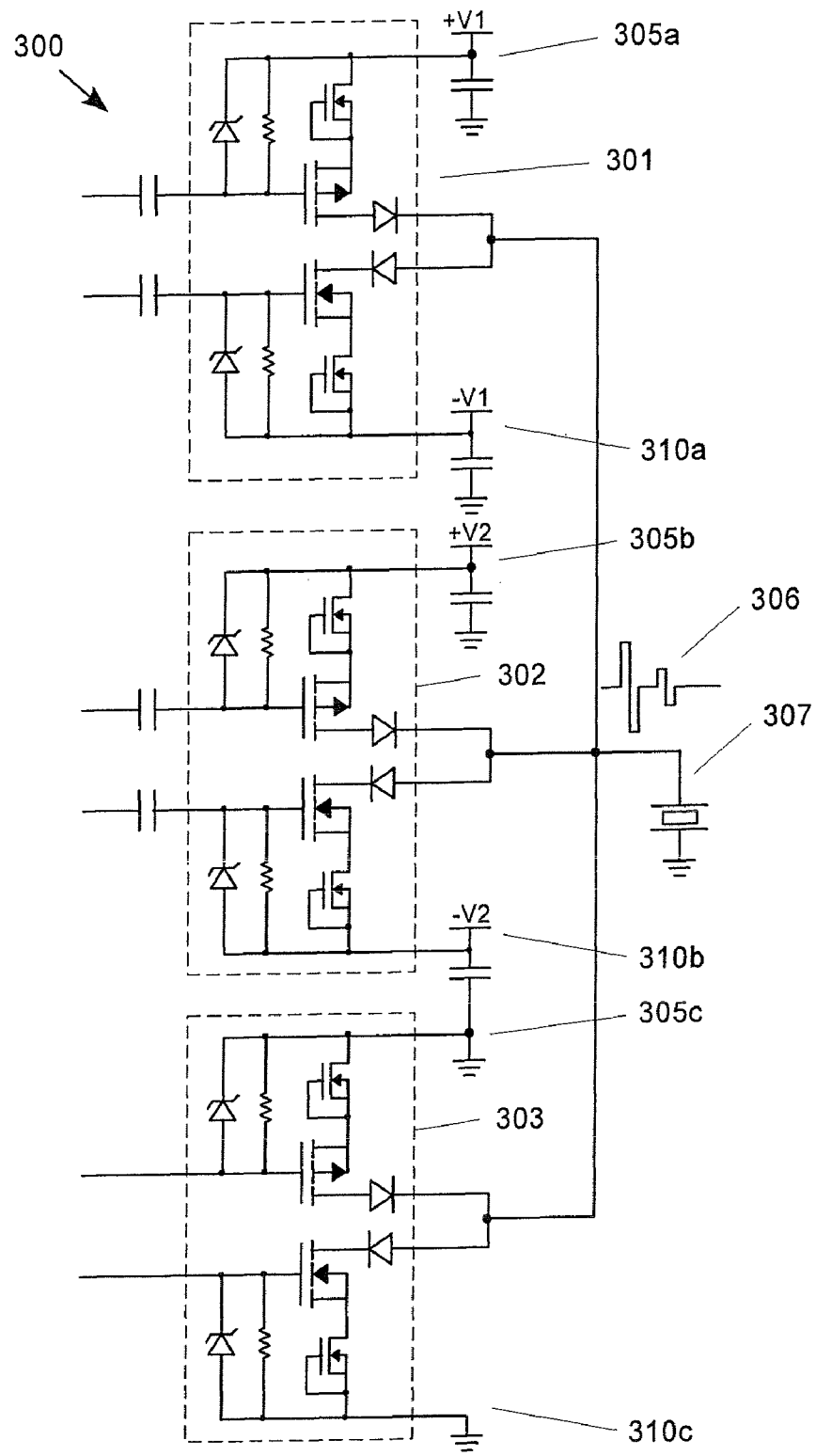
FIG. 3 is a schematic diagram illustrating a circuit architecture topology of a 5-level ultrasound transducer excitation waveform integrated device circuit.

Referring now to FIG. 3, a 5-level ultrasound transmit pulse generator circuit 300 is shown. The circuit 300 is formed of a plurality of circuits 200 coupled together. In the present embodiment, three circuits 200 are used wherein the circuits are numbered 301, 302 and 303. The voltage supplies 305a and 310a have different absolute voltage values as the supplies 305b and 310b to generate four waveform levels, when the pulse generate circuit 301 is activated followed by activation of the circuit 302. The "return to zero" function is provided by the third circuit 303 when the "supply voltage" rails are both connect to zero volt or ground. The typical waveform this circuit can generate is shown as waveform 306 in FIG. 3.

Figure 4:
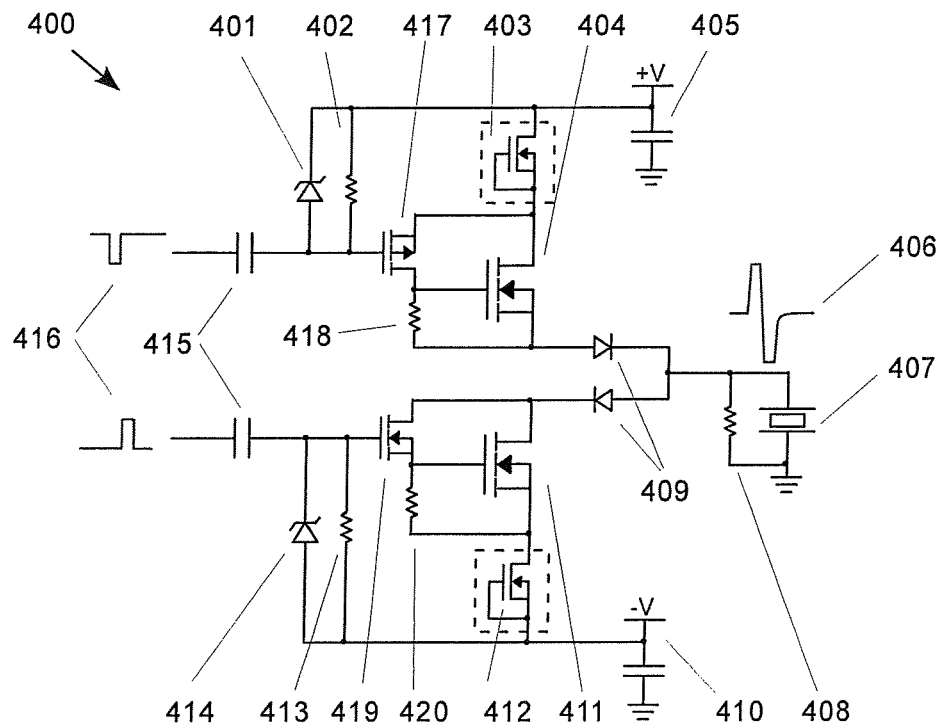
FIG. 4 is a schematic detail diagram illustrating a circuit architecture topology of an ultrasound pulse generator using N-type MOSFETs for both positive going and negative going current switches.

Referring now to FIG. 4, a complementary switched current source circuit 400 is shown. The circuit 400 has a pair of gate coupling capacitors 415. Each of the pair of gate coupling capacitors 415 has a first terminal coupled to a waveform 216. Each of the coupling capacitors 415 is driven by the control waveform 216 which is generated by a gate driver circuit.

The circuit 400 uses small P-type MOSFET 417 and small N-type MOSFET 419 with a pair of N-type MOSFET 404 and 411. This arrangement replaces the complementary P-type MOSFET 204 and N-type MOSFET 211 of FIG. 2. The benefit of this novel implementation is twofold. Not only does this configuration save a lot of silicon area, since to approximately match the MOSFET voltage and current, the P-type MOSFET is generally two to three times bigger than the N-type MOSFET, but it also reduces the gate driver current.

The P-type MOSFETs 417 and 419 each have a gate terminal coupled to one the coupling capacitors 415A and 415B respectively. Each P-type MOSFET 417 and 419 is further coupled to a resistive element 418 and 420 respectively. The pair of N-type MOSFETs 404 and 411 are each connected in series with current control devices 403 and 412 respectively and power supply rails 405 and 410 respectively. Each of the pair of N-type MOSFETs 404 and 411 is further coupled to one of the P-type MOSFET 417 and 419.

The circuit 400 has a pair of Zener diodes 401 and 414. The Zener diodes 401 and 414 have a first terminal coupled to the positive and negative high voltage power supply rail 405 and 410 respectively and a second terminal coupled to one of the pair of gate coupling capacitors 415A or 415B. The Zener diodes 401 and 414 are in parallel with gate-source DC bias voltage resistors 402 and 413 respectively. The Zener diodes 401 and 414 serve the same function as they do in the previous embodiments.

The circuit 400 has a pair of switching diodes 409. Each of the switching diodes 409 has a first terminal coupled to one of the N-type MOSFETs 404 or 411 and a second terminal coupled to a resistor 408. The resistor 408 is coupled in parallel with a transducer 407.

As previously stated, the benefit of this novel implementation is twofold. Not only does this configuration save a lot of silicon area, since to approximately match the MOSFET voltage and current, the P-type MOSFET is generally two to three times bigger the N-type MOSFET, but it also reduces the gate driver current.

Figure 5:
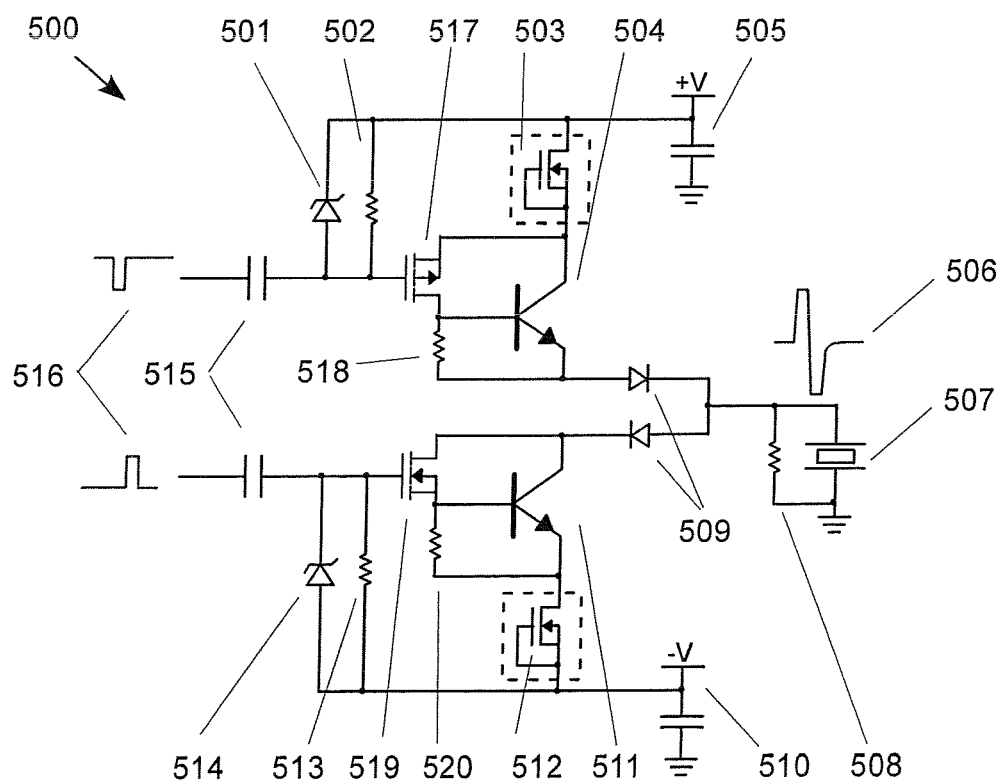
FIG. 5 is a schematic detail diagram illustrating both output MOSFETs in the high voltage switched current source of the transmit pulse generator in FIG. 4 being replaced by bipolar transistors.

Referring to FIG. 5, another embodiment of a complementary switched current source circuit 500 is shown. This embodiment is similar to that shown in FIG. 4, thus only the differences will be discussed. In the present embodiment, two bipolar transistor devices 504 and 511 are used and replace MOSFETs 404 and 411 in FIG. 4. By using the bipolar transistor devices 504 and 511, one is able to further reduce the die size of the integrated circuit of the previous embodiments.

Figure 6:
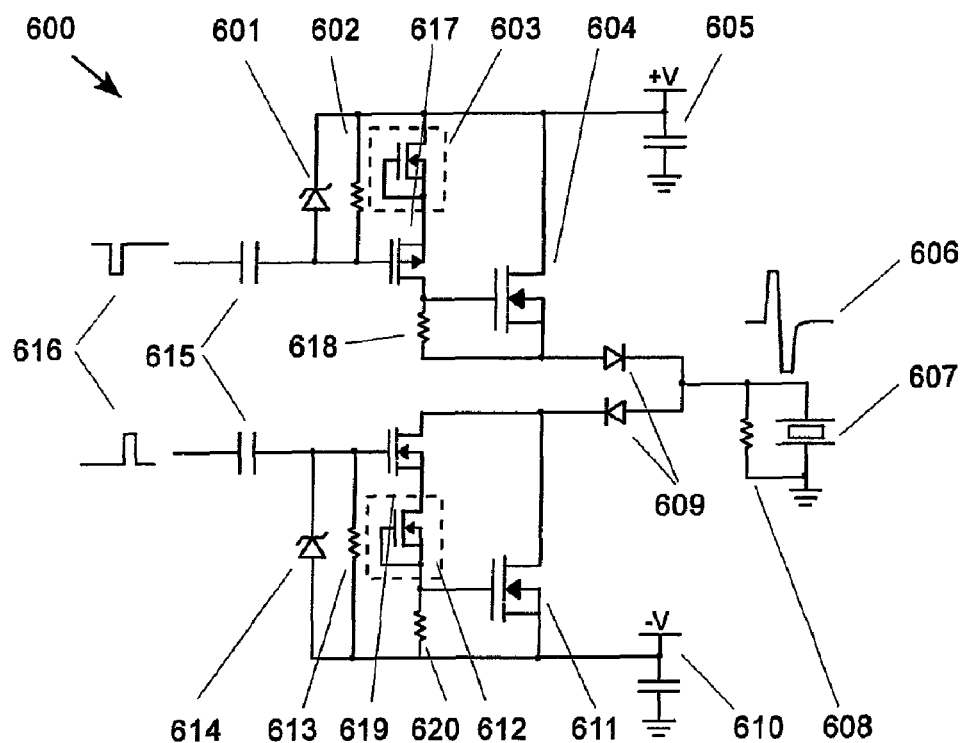
FIG. 6 is a schematic detail diagram illustrating a smaller switched current source to control the output MOSFETs in the transmit pulse generator.
Figure 7:
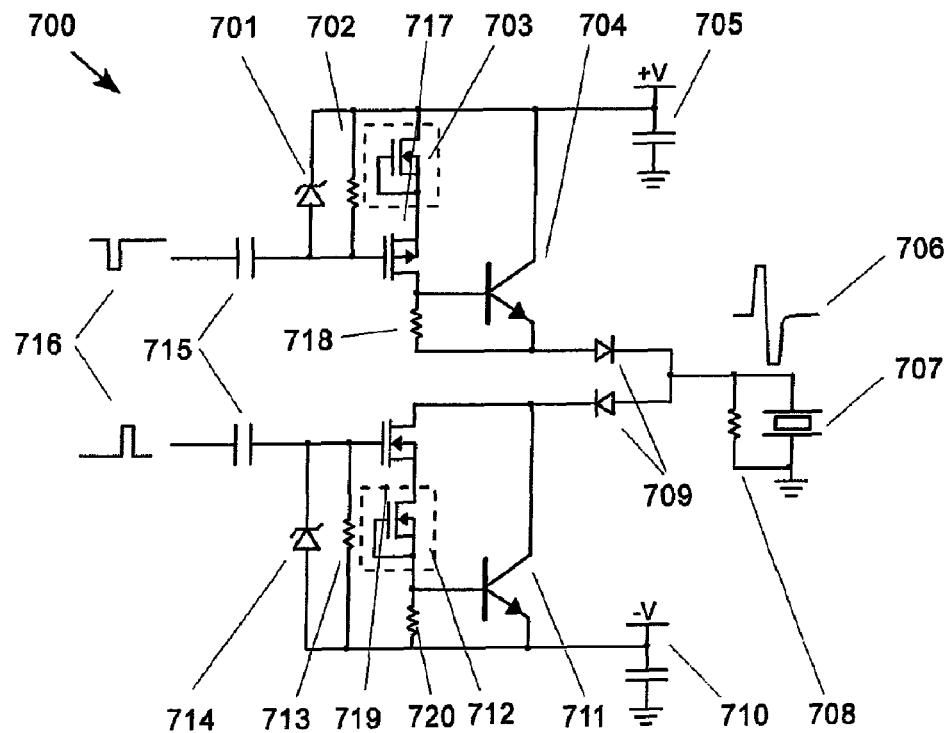
FIG. 7 is a schematic detail diagram illustrating both output MOSFETs in a high voltage switched current source of the transmit pulse generator in FIG. 6 replaced with bipolar transistors.

Referring now to FIG. 6, another complementary switched current source circuit 600 is disclosed. The circuit 600 is similar to that shown in FIG. 4. However, circuit 600 uses smaller current sources 603 and 612 and smaller control switches 617 and 619 for regulating the currents passing through the matched resistors 618 and 620 to control the matched output N-type MOSFETs 604 and 611, to generate the matched, or almost matched output charge/discharge currents via diodes 609. Because the current sources and control switches are both smaller, the present embodiment will further save circuit silicon die area Referring now to FIG. 7, another complementary switched current source circuit 700 is disclosed. The circuit 700 is similar to that shown in FIG. 6. In the present embodiment, the output MOSFETs 604 and 611 are replaced by bipolar transistors 704 and 711. This topology can further save circuit silicon die area in the integrated circuit.

Figure 8:
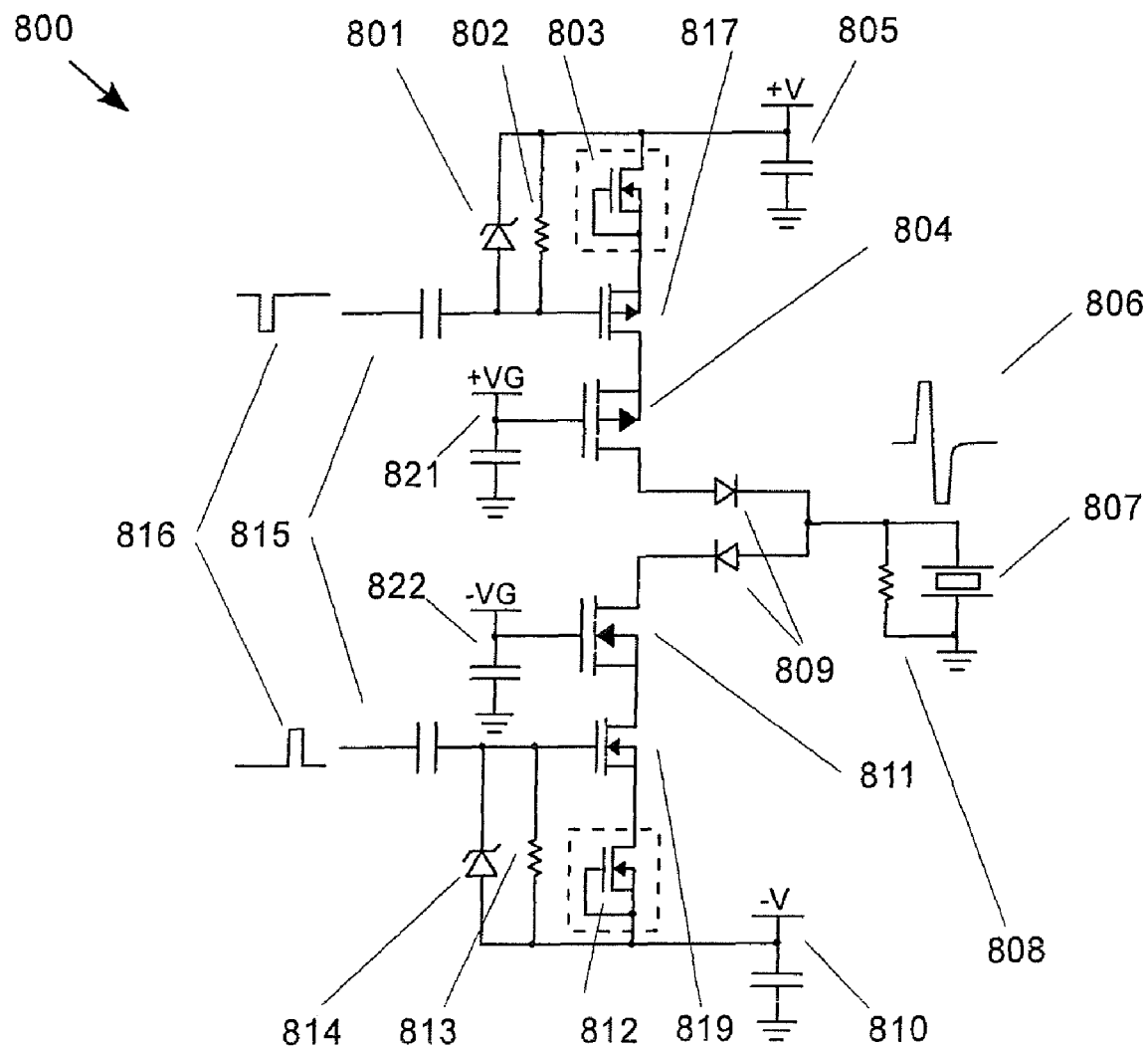
FIG. 8 is a schematic detail diagram of a high voltage switched current source of the transmit pulse generator wherein the high voltage MOSFETs are source driven.

Referring now to FIG. 8, another complementary switched current source circuit 800 is disclosed. The circuit 800 is similar to that shown in FIG. 6. However, in FIG. 8, the output MOSFETs 804 and 811 are source-driven. That means that the output MOSFET gates are kept at fixed gate voltages of +VG and −VG supplied by 821 and 822. In this topology the source-driver circuit components 817, 803, 819 and 812 can be low voltage components. The circuit 800 not only reduces the number of high voltage components, but also speeds up the current rise and fall timings due to the source-driving topology While embodiments of the disclosure have been described in terms of various specific embodiments, those skilled in the art will recognize that the embodiments of the disclosure can be practiced with modifications within the spirit and scope of the claims.

What is claimed is:

1. A complementary high voltage switched current source circuit comprising:
   a P-type device having first, second and third terminals;
   an N-type device having first, second and third terminals;
   a pair of transistor devices, wherein each of the transistor devices having first, second and third terminals, a first of the pair of transistor devices is coupled to the P-type device, and a second of the pair of transistor devices coupled to the N-type device;
   a pair of Zener diodes, wherein a first of the pair of Zener diodes is attached to the P-type device and to a positive voltage rail and a second of the pair of Zener diodes is attached to the N-type device and to the negative voltage rail;
   a pair of resistive elements, wherein a first of the pair of resistive element is in parallel with the first Zener diode, and a second of the pair of resistive element is in parallel with the second Zener diode;
   a pair of capacitive elements, wherein a first capacitive element is coupled to the first Zener diode and to a first control waveform, and a second capacitive element is coupled to the second Zener diode and to a second control waveform; and
   a pair of switching diodes, wherein a first switching diode is attached to the first of the pair of transistor devices and the second switching diode is attached to the second of the pair of transistor devices and to the first switching diode; and
   a pair of switches, wherein a first switch is attached to the P-type device, the first transistor of the pair of transistors, the first Zener diode, first resistive element and the first capacitive element and a second switch is attached to the N-type device, the second transistor of the pair of transistors, the second Zener diode, second resistive element and the second capacitive element.

2. A complementary high voltage switched current source circuit in accordance with claim 1, wherein the pair of switches are matched to provide current matching between positive and negative going currents when one of the pair of switches is active.

3. A complementary high voltage switched current source circuit in accordance with claim 1, wherein the pair of transistor devices is a pair of N-type MOSFETS.

4. A complementary high voltage switched current source circuit in accordance with claim 1, wherein the pair of transistor devices is a pair of bipolar transistors.

* * * * *